US010324504B2

(12) United States Patent
Strickland et al.

(10) Patent No.: US 10,324,504 B2
(45) Date of Patent: *Jun. 18, 2019

(54) STORAGE DEVICE MOUNTING SYSTEM

(71) Applicant: EMC IP Holding Company LLC, Hopkinton, MA (US)

(72) Inventors: Stephen E. Strickland, Foxboro, MA (US); Lawrence J. Feroli, West Townsend, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/037,609

(22) Filed: Jul. 17, 2018

(65) Prior Publication Data

US 2018/0321714 A1    Nov. 8, 2018

Related U.S. Application Data (63) Continuation of application No. 15/075,887, filed on Mar. 21, 2016, now Pat. No. 10,031,561.

(51) Int. Cl.
*G06F 1/18* (2006.01)
*H05K 7/14* (2006.01)
*G11B 33/12* (2006.01)

(52) U.S. Cl.
CPC ............ *G06F 1/187* (2013.01); *G11B 33/128* (2013.01); *H05K 7/1489* (2013.01); *H05K 7/1492* (2013.01)

(58) Field of Classification Search
CPC ..... G06F 1/187; H05K 7/1489; H05K 7/1492
See application file for complete search history.

(56) References Cited

U.S. PATENT DOCUMENTS

| | | | |
|---|---|---|---|
| 5,572,402 A | 11/1996 | Jeong | |
| 6,373,696 B1* | 4/2002 | Bolognia | G06F 1/184 361/679.33 |
| 6,392,875 B1* | 5/2002 | Erickson | G06F 1/184 360/98.08 |
| 6,535,391 B2* | 3/2003 | Larsen | G06F 1/184 312/223.1 |
| 6,882,527 B2* | 4/2005 | Wang | G06F 1/184 312/223.2 |
| 7,257,827 B2* | 8/2007 | Lee | G11B 33/022 312/223.2 |
| 7,643,280 B2* | 1/2010 | Chen | G11B 33/123 361/679.33 |

(Continued)

OTHER PUBLICATIONS

Non-Final Office Action issued in U.S. Appl. No. 15/075,887 dated Dec. 23, 2016.

(Continued)

*Primary Examiner* — Nidhi Thaker
(74) *Attorney, Agent, or Firm* — Brian J. Colandreo; Heath M. Sargeant; Holland & Knight LLP (57) ABSTRACT

A storage device mounting system includes a cage assembly configured to receive one or more storage devices. A pivot assembly is configured to pivotally attach the cage assembly to a chassis assembly. A flexible conductor assembly is configured to electrically couple the one or more storage devices to a system board assembly while allowing the cage assembly to pivot with respect to the chassis assembly.

17 Claims, 5 Drawing Sheets

(56) References Cited

U.S. PATENT DOCUMENTS

| | | | | |
|---|---|---|---|---|
| 8,054,620 B2* | 11/2011 | Roesner | ............... | G11B 33/128 |
| | | | | 312/223.2 |
| 2009/0016014 A1 | 1/2009 | Tu | | |
| 2010/0073861 A1* | 3/2010 | Takeguchi | ............ | G06F 1/1616 |
| | | | | 361/679.33 |
| 2013/0119837 A1 | 5/2013 | Gong | | |

OTHER PUBLICATIONS

Final Office Action issued in counterpart U.S. Appl. No. 15/075,887 dated May 10, 2017.
Non-Final Office Action issued in U.S. Appl. No. 15/075,887 dated Sep. 7, 2017.
Notice of Allowance issued in U.S. Appl. No. 15/075,887 dated Mar. 29, 2018.

* cited by examiner

STORAGE DEVICE MOUNTING SYSTEM

TECHNICAL FIELD

This disclosure relates to IT components and, more particularly, to systems for mounting storage devices within IT components.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks and need to be serviced in the field. Naturally, the quicker these components can be serviced, the less downtime for the components.

SUMMARY OF DISCLOSURE

In one implementation, a storage device mounting system includes a cage assembly configured to receive one or more storage devices. A pivot assembly is configured to pivotally attach the cage assembly to a chassis assembly. A flexible conductor assembly is configured to electrically couple the one or more storage devices to a system board assembly while allowing the cage assembly to pivot with respect to the chassis assembly.

One or more of the following features may be included. A latch assembly may be configured to releasably maintain the cage assembly in a position proximate the chassis assembly. The latch assembly may be further configured to releasably maintain the cage assembly in a position angularly displaced with respect to the chassis assembly. The flexible conductor assembly may include a flexible printed circuit board. The flexible conductor assembly may include a cable assembly. The pivot assembly may include a hinge assembly. The cage assembly may include one or more retention assemblies configured to releasably retain the one or more storage devices within the cage assembly. The chassis assembly may be a portion of an IT component. The IT component may be chosen from the group consisting of: a server system, a disk array system, a storage processor system, and a storage processor/disk system.

In another implementation, an IT component includes a chassis assembly, a system board assembly, and a storage device mounting system. The storage device mounting system includes: a cage assembly configured to receive one or more storage devices, a pivot assembly configured to pivotally attach the cage assembly to the chassis assembly, and a flexible conductor assembly configured to electrically couple the one or more storage devices to the system board assembly while allowing the cage assembly to pivot with respect to the chassis assembly.

One or more of the following features may be included. The storage device mounting system may further include a latch assembly configured to releasably maintain the cage assembly in a position proximate the chassis assembly. The latch assembly may be further configured to releasably maintain the cage assembly in a position angularly displaced with respect to the chassis assembly. The flexible conductor assembly may include a flexible printed circuit board. The pivot assembly may include a hinge assembly. The cage assembly may include one or more retention assemblies configured to releasably retain the one or more storage devices within the cage assembly. The IT component may be chosen from the group consisting of: a server system, a disk array system, a storage processor system, and a storage processor/disk system. The IT component may be chosen from the group consisting of: a 1 U IT component; a 2 U IT component; and a 3 U IT component.

In another implementation, a storage device mounting system includes a cage assembly configured to receive one or more storage devices. A pivot assembly is configured to pivotally attach the cage assembly to a chassis assembly. A flexible conductor assembly is configured to electrically couple the one or more storage devices to a system board assembly while allowing the cage assembly to pivot with respect to the chassis assembly. The flexible conductor assembly includes a flexible printed circuit board. A latch assembly is configured to releasably maintain the cage assembly in a position proximate the chassis assembly.

One or more of the following features may be included. The pivot assembly may include a hinge assembly. The cage assembly may include one or more retention assemblies configured to releasably retain the one or more storage devices within the cage assembly.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
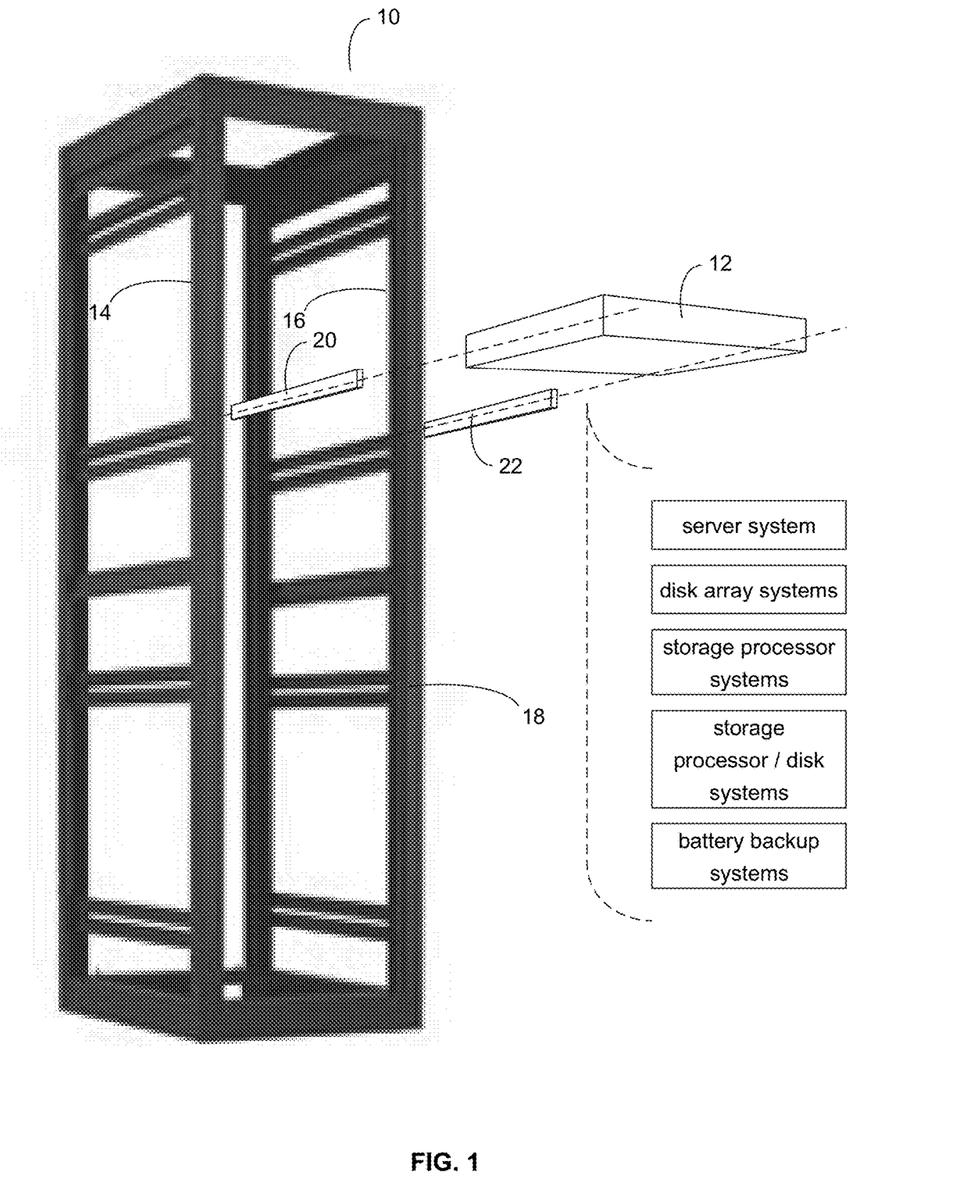
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT devices that fit within a first IT rack may also fit within a second IT rack.

These various IT components (e.g., IT component 12) may be available in standardized heights based upon the number of rack units (U's). Examples of such standardized heights may include but are not limited to 1 U IT components, 2 U IT components, 3 U IT components, and 4 U IT components, wherein a 1 U IT component is half as high as a 2 U IT component, which is half as high as a 4 U IT component.

IT racks (e.g., IT rack 10) may be available in various heights, which are capable of accommodating a defined number of rack units (U's). However, while the number of rack units available within a particular IT rack may be rigidly defined by the height of the IT rack, the number of IT components mountable within that IT rack may vary depending upon the height in rack units (U's) of the particular IT components being mounted within that IT rack. Therefore, by reducing the number of rack units utilized by a particular IT component within an IT rack, additional IT components may be mounted within the IT rack.

Figure 2A:
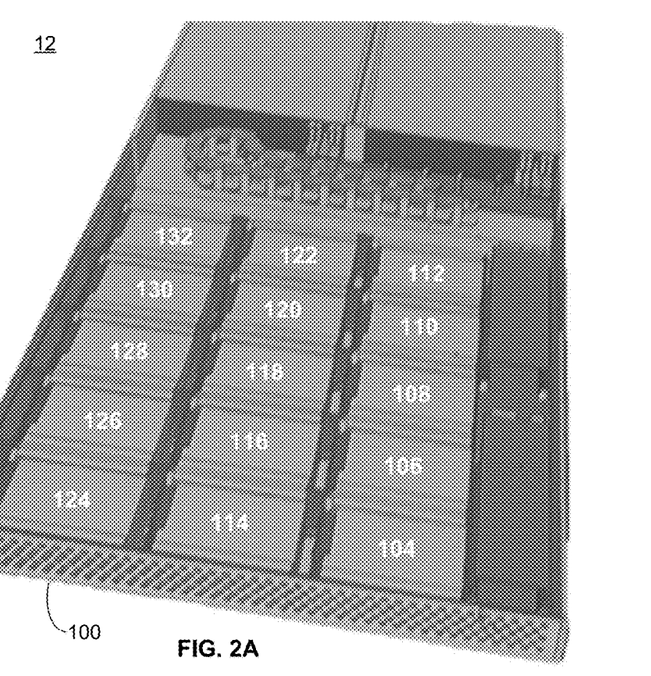
FIG. 2A is a perspective view of the IT component of FIG. 1.
Figure 2B:
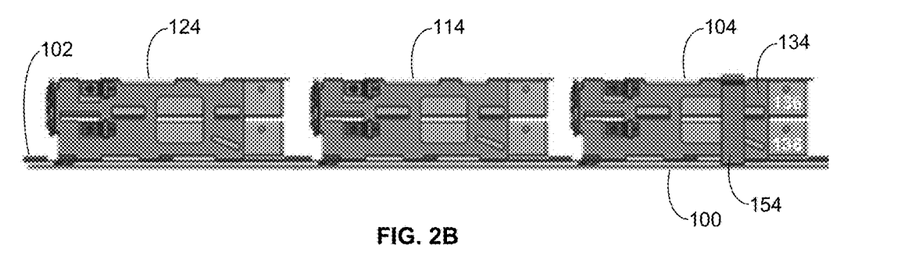
FIG. 2B is a front view of the IT component of FIG. 1.

Referring also to FIGS. 2A & 2B, there is shown the internal components of one implementation of IT component 12, wherein IT component 12 is shown to include chassis assembly 100, system board assembly 102, and storage device mounting system 104. In this particular implementation, IT Component 12 is shown to be a 1 U IT component that includes fifteen storage device mounting systems (namely storage device mounting systems 104, 106, 108, 110, 112, 114, 116, 118, 120, 122, 124, 126, 128, 130, 132). Storage device mounting systems 104, 106, 108, 110, 112, 114, 116, 118, 120, 122, 124, 126, 128, 130, 132 may be constructed of various materials, such as formed sheet metal, cast metal and/or molded plastic.

Each of the various storage device mounting systems (e.g., storage device mounting system 104) may include cage assembly 134 configured to receive one or more storage devices (e.g., storage devices 136, 138). Examples of storage devices 136, 138 may include but are not limited to one or more electro-mechanical hard disk drives and/or one or more solid-state/flash devices. While the above discussion concerns storage device mounting system 104, it is understood that each of storage device mounting systems 104, 106, 108, 110, 112, 114, 116, 118, 120, 122, 124, 126, 128, 130, 132 may be configured to receive two storage devices. Accordingly and in the above-described implementation of IT component 12, IT component 12 is shown to include thirty storages devices (i.e., fifteen storage device mounting systems each of which includes two storage devices).

While in the above-described example, each of storage device mounting systems 104, 106, 108, 110, 112, 114, 116, 118, 120, 122, 124, 126, 128, 130, 132 is described as including two storage devices, this is for illustrative purposes only, as other configurations are possible and are considered to be within the scope of this disclosure. For example, each of storage device mounting systems 104, 106, 108, 110, 112, 114, 116, 118, 120, 122, 124, 126, 128, 130, 132 may be configured to include e.g., one storage device, three storage devices, or four storage devices.

Figure 3A:
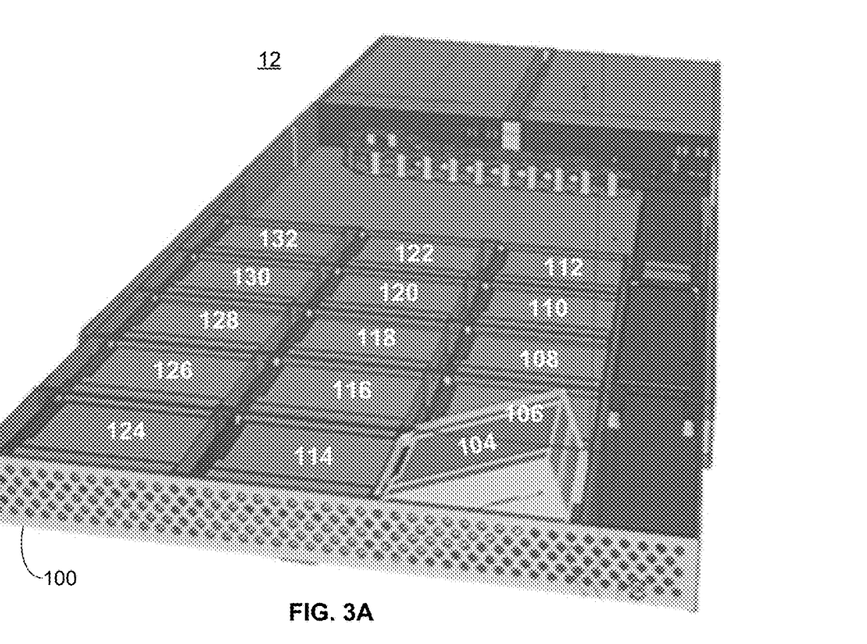
FIG. 3A is another perspective view of the IT component of FIG. 1.
Figure 3B:
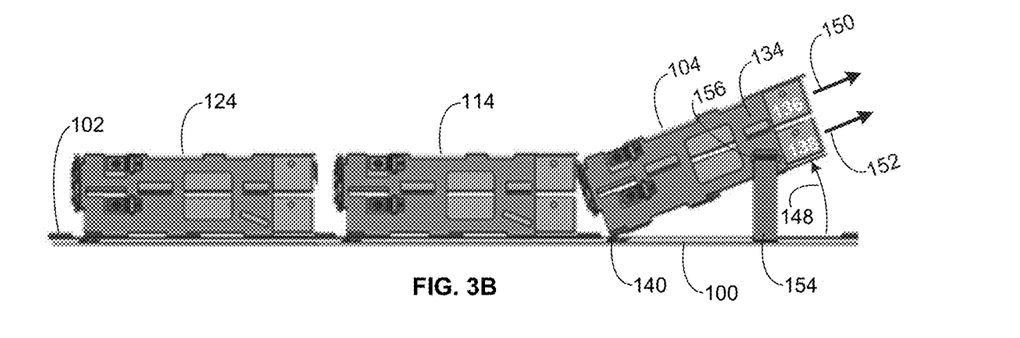
FIG. 3B is another front view of the IT component of FIG. 1.
Figure 3C:
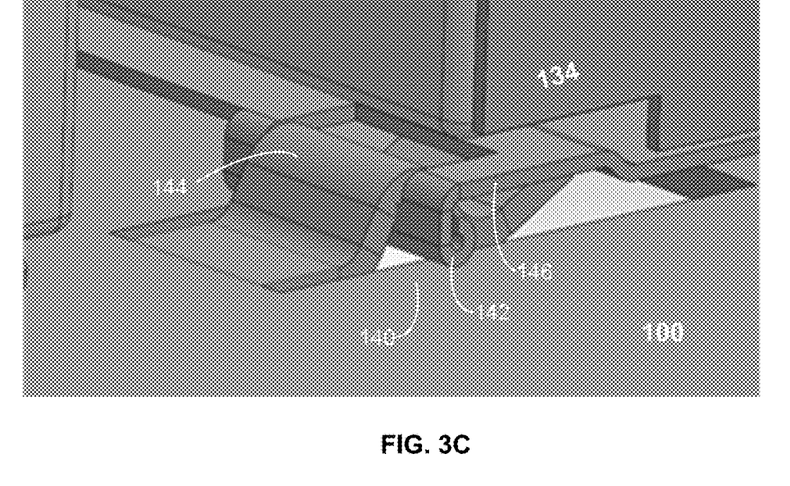
FIG. 3C is perspective view of a pivot assembly of the IT component of FIG. 1.

While the following discussion concerns storage device mounting system 104, it is understood that this discussion may also concern storage device mounting systems 106, 108, 110, 112, 114, 116, 118, 120, 122, 124, 126, 128, 130, 132. Referring also to FIGS. 3A, 3B & 3C, storage device mounting system 104 may include pivot assembly 140 that may be configured to pivotally attach cage assembly 134 to chassis assembly 100. Pivot assembly 140 may include hinge assembly 142, wherein a lower portion (e.g., portion 144) of hinge assembly 142 may be built into/formed within chassis assembly 100 and an upper portion (e.g., portion 146) of hinge assembly 142 may be built into/formed within cage assembly 134. Through the use of pivot assembly 140, cage assembly 134 may be pivoted (in the direction of arc 148) away from any obstructions (e.g., other storage device mounting systems) on chassis 100 and system board assembly 102, thus allowing storage device 136 and/or storage device 138 may be removed in the direction of arrows 150, 152 (respectively).

Storage device mounting system 104 may further include latch assembly 154 configured to releasably maintain cage assembly 134 in a position proximate chassis assembly 100. In this example, latch assembly 154 may be a resilient metal latch that is biased to snap into place above cage assembly 134, thus maintain cage assembly 134 in (in this example) an essentially horizontal position proximate chassis assembly 100 (as shown in FIG. 2B).

Latch assembly 122 may be further configured to releasably maintain cage assembly 134 in a position angularly displaced with respect to chassis assembly 100. In this example, latch assembly 154 is shown to be biased to releasably engage recess 156 included within cage assembly 134, thus maintaining cage assembly 134 in a position that is angularly displaced with respect to chassis assembly 100 (e.g., as shown in FIG. 3B).

Figure 4:
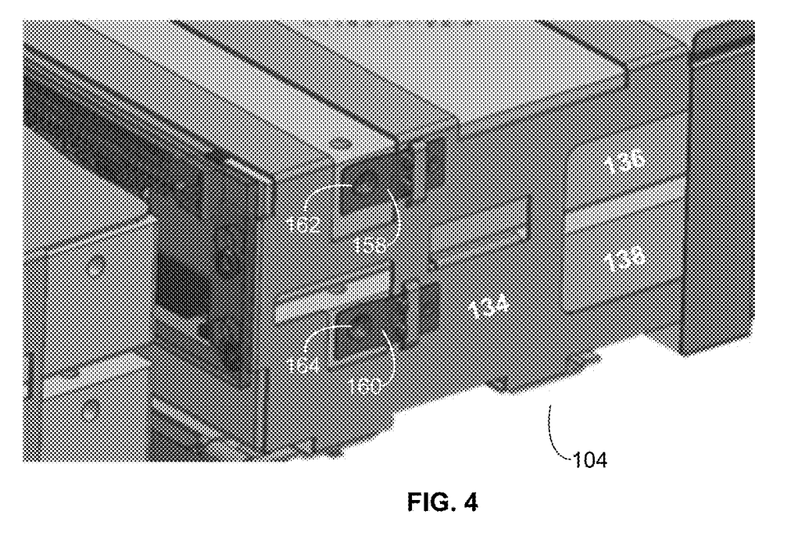
FIG. 4 is a perspective view of a retention assembly of the IT component of FIG. 1.

Referring also to FIG. 4, cage assembly 134 may include one or more retention assemblies (e.g., retention assemblies 158, 160) configured to releasably retain the one or more storage devices (e.g., storage devices 136, 138) within cage assembly 134. In one implementation, retention assembly 158 may include resilient member 162 that is biased to releasably engage one of the mounting screw holes included within storage device 136; and retention assembly 160 may include resilient member 164 that is biased to releasably engage one of the mounting screw holes included within storage device 138

Figure 5:
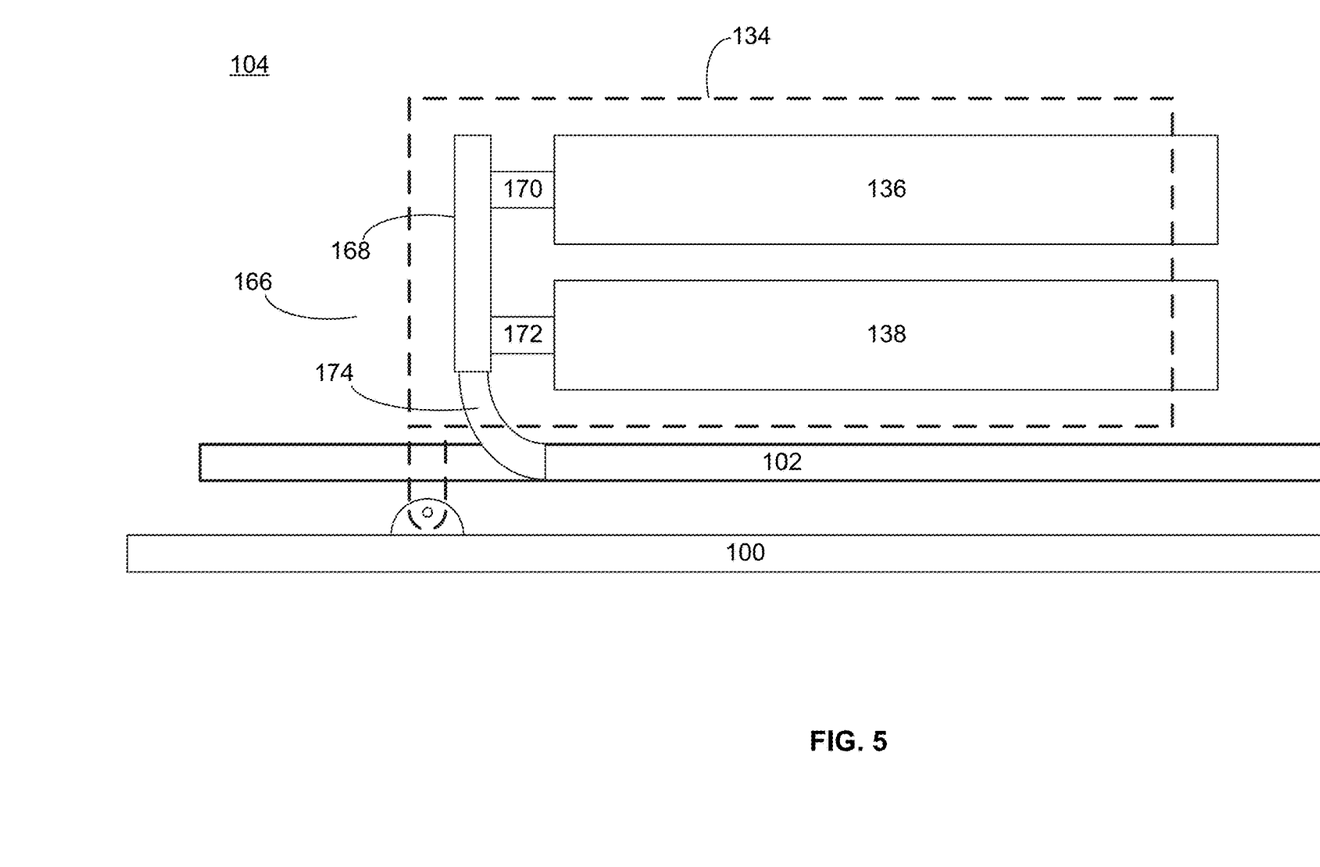
FIG. 5 is a perspective view of a flexible conductor assembly of the IT component of FIG. 1.

Referring also to FIG. 5, storage device mounting system 104 may include flexible conductor assembly 166 that may be configured to electrically couple the one or more storage devices (e.g., storage devices 136, 138) to system board assembly 102 while allowing cage assembly 134 to pivot with respect to chassis assembly 100. Accordingly and through the use of flexible conductor assembly 166, electrical connectivity may be maintained between the storage devices (e.g., storage devices 136, 138) and system board assembly 102 while cage assembly 134 pivots (with respect to chassis assembly 100) between the position shown in FIG. 2B (i.e., an essentially horizontal position proximate chassis assembly 100) and the position shown in FIG. 3B (i.e., a position angularly displaced with respect to chassis assembly 100).

Flexible conductor assembly 166 may include sub-board assembly 168 that is flexibly electrically coupled to system board assembly 102. Sub-board assembly 168 may include one or more connector assemblies (e.g., connector assemblies 170, 172) for releasably electrically coupling storage devices 136, 138 (respectively) to sub-board assembly 168. Flexible conductor assembly 166 may include flexible electrical conductor 174 for flexibly electrically coupling sub-board assembly 168 to system board assembly 102, wherein examples of flexible electrical conductor 174 may include but are not limited to: a flexible printed circuit board and a high-speed data cable assembly (and any required connectors).

General

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A storage device mounting system comprising:
  a cage assembly configured to receive one or more storage devices;
  a pivot assembly configured to pivotally attach the cage assembly to a chassis assembly, wherein the pivot assembly includes a hinge assembly comprising a lower portion built into the chassis assembly and an upper portion built into a rear end of the cage assembly, wherein the hinge assembly is displaced underneath the cage assembly;
  a latch assembly biased to releasably engage one or more recesses included within a front end of the cage assembly and configured to releasably maintain the cage assembly in one or more positions angularly displaced with respect to the chassis assembly wherein the one or more recesses included within the front end of the cage assembly are not in communication with each other; and
  a flexible conductor assembly configured to electrically couple the one or more storage devices to a system board assembly while allowing the cage assembly to pivot with respect to the chassis assembly.

2. The storage device mounting system of claim 1, wherein the latch assembly is further configured to releasably retain the cage assembly against the chassis assembly.

3. The storage device mounting system of claim 1, wherein the cage assembly includes one or more retention assemblies configured to releasably engage one or more mounting recesses within each of the one or more storage devices and releasably retain the one or more storage devices within the cage assembly.

4. The storage device mounting system of claim 1, wherein the flexible conductor assembly includes a flexible printed circuit board.

5. The storage device mounting system of claim 1, wherein the flexible conductor assembly includes a cable assembly.

6. The storage device mounting system of claim 1, wherein the one or more storage devices include at least one of an electro-mechanical hard disk drive and a solid-state drive.

7. The storage device mounting system of claim 1, wherein the chassis assembly is a portion of an IT component.

8. The storage device mounting system of claim 7, wherein the IT component is chosen from the group consisting of: a server system, a disk array system, a storage processor system, and a storage processor/disk system.

9. An IT component comprising:
  a chassis assembly;
  a system board assembly; and
  a storage device mounting system including:
    a cage assembly configured to receive one or more storage devices,
    a pivot assembly configured to pivotally attach the cage assembly to a chassis assembly, wherein the pivot assembly includes a hinge assembly comprising a lower portion built into the chassis assembly and an upper portion built into a rear end of the cage assembly, wherein the hinge assembly is displaced underneath the cage assembly,
    a latch assembly biased to releasably engage one or more recesses included within a front end of the cage assembly and configured to releasably maintain the cage assembly in one or more positions angularly displaced with respect to the chassis assembly, wherein the one or more recesses included within the front end of the cage assembly are not in communication with each other, and
    a flexible conductor assembly configured to electrically couple the one or more storage devices to the system board assembly while allowing the cage assembly to pivot with respect to the chassis assembly.

10. The IT component of claim 9, wherein the latch assembly is further configured to releasably retain the cage assembly against the chassis assembly.

11. The IT component claim 9, wherein the cage assembly includes one or more retention assemblies configured to releasably engage one or more mounting recesses within each of the one or more storage devices and releasably retain the one or more storage devices within the cage assembly.

12. The IT component of claim 9, wherein the flexible conductor assembly includes a flexible printed circuit board.

13. The IT component claim 9, wherein the one or more storage devices include at least one of an electro-mechanical hard disk drive and a solid-state drive.

14. The IT component of claim 9, wherein the IT component is chosen from the group consisting of: a server system, a disk array system, a storage processor system, and a storage processor/disk system.

15. The IT component of claim 9, wherein the IT component is chosen from the group consisting of:
   a 1 U IT component;
   a 2 U IT component; and
   a 3 U IT component.

16. A storage device mounting system comprising:
   a cage assembly configured to receive one or more storage devices;
   a pivot assembly configured to pivotally attach the cage assembly to a chassis assembly, wherein the pivot assembly includes a hinge assembly comprising a lower portion built into the chassis assembly and an upper portion built into a rear end of the cage assembly, wherein the hinge assembly is displaced underneath the cage assembly;
   a flexible conductor assembly configured to electrically couple the one or more storage devices to a system board assembly while allowing the cage assembly to pivot with respect to the chassis assembly, wherein the flexible conductor assembly includes a flexible printed circuit board; and
   a latch assembly biased to releasably engage one or more recesses included within a front end of the cage assembly and configured to releasably maintain the cage assembly in one or more positions angularly displaced with respect to the chassis assembly, wherein the one or more recesses included within the front end of the cage assembly are not in communication with each other.

17. The storage device mounting system of claim 16, wherein the cage assembly includes one or more retention assemblies configured to releasably engage one or more mounting recesses within each of the one or more storage devices and releasably retain the one or more storage devices within the cage assembly.

* * * * *